United States Patent
Tago et al.

(10) Patent No.: US 9,252,132 B2
(45) Date of Patent: Feb. 2, 2016

(54) SEMICONDUCTOR DEVICE AND SEMICONDUCTOR MODULE

(71) Applicant: Murata Manufacturing Co., Ltd., Nagaokakyo-shi, Kyoto-fu (JP)

(72) Inventors: Shigeru Tago, Nagaokakyo (JP); Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 17 days.

(21) Appl. No.: 14/224,166

(22) Filed: Mar. 25, 2014

(65) Prior Publication Data

US 2014/0203454 A1    Jul. 24, 2014

Related U.S. Application Data

(63) Continuation of application No. PCT/JP2013/053019, filed on Feb. 8, 2013.

(30) Foreign Application Priority Data

Mar. 22, 2012 (JP) .................................. 2012-064804

(51) Int. Cl.
*H01L 23/02* (2006.01)
*H01L 25/065* (2006.01)
*H01L 23/498* (2006.01)
(Continued)

(52) U.S. Cl.
CPC .......... *H01L 25/0657* (2013.01); *H01L 23/481* (2013.01); *H01L 23/49827* (2013.01); *H01L 23/5389* (2013.01); *H01L 24/20* (2013.01); *H05K 1/185* (2013.01); *H01L 23/3114* (2013.01); *H01L 23/525* (2013.01); *H01L 23/5286* (2013.01); *H01L 2224/0401* (2013.01); *H01L 2224/04105* (2013.01); *H01L 2224/06182* (2013.01); *H01L 2224/16225* (2013.01); *H01L 2224/16227* (2013.01);
(Continued)

(58) Field of Classification Search
None
See application file for complete search history.

(56) References Cited

U.S. PATENT DOCUMENTS 5,027,183 A * 6/1991 Dreps ........................... 257/544
5,144,753 A * 9/1992 Murphy ......................... 33/514
(Continued)

FOREIGN PATENT DOCUMENTS

| JP | 6-163823 A | 6/1994 |
|---|---|---|
| JP | 2001-156209 A | 6/2001 |

(Continued)

OTHER PUBLICATIONS

Official Communication issued in International Patent Application No. PCT/JP2013/053019, mailed on Mar. 12, 2013.
(Continued)

*Primary Examiner* — Jarrett Stark
(74) *Attorney, Agent, or Firm* — Keating & Bennett, LLP (57) ABSTRACT

A semiconductor device includes an analog integrated circuit and a digital integrated circuit provided on a major surface of a substrate. An analog ground terminal is provided for the analog integrated circuit, and digital ground terminals are provided for the digital integrated circuit. An analog ground layer is stacked on the substrate so as to face the analog integrated circuit, and digital ground layers are stacked on the substrate so as to face the digital integrated circuit. The analog ground terminal is connected to the analog ground layer, and the digital ground terminals are connected to the digital ground layers, respectively.

17 Claims, 6 Drawing Sheets

(51) Int. Cl.
*H01L 23/538* (2006.01)
*H01L 23/00* (2006.01)
*H01L 23/48* (2006.01)
*H05K 1/18* (2006.01)
*H01L 23/31* (2006.01)
*H01L 23/525* (2006.01)
*H01L 23/528* (2006.01)

(52) U.S. Cl.
CPC .............. *H01L 2924/00013* (2013.01); *H01L 2924/19105* (2013.01); *H05K 2201/09972* (2013.01)

(56) References Cited

U.S. PATENT DOCUMENTS

| | | | |
|---|---|---|---|
| 5,900,763 A * | 5/1999 | Rahim et al. | 327/292 |
| 5,994,741 A | 11/1999 | Koizumi et al. | |
| 6,395,591 B1 * | 5/2002 | McCormack et al. | 438/199 |
| 6,501,169 B1 | 12/2002 | Aoki et al. | |
| 2004/0164427 A1 * | 8/2004 | Seaman et al. | 257/780 |
| 2005/0161798 A1 | 7/2005 | Ninomiya et al. | |
| 2009/0057848 A1 | 3/2009 | Johnson | |
| 2009/0206490 A1 | 8/2009 | Koide et al. | |
| 2010/0127351 A1 * | 5/2010 | Quinn | 257/534 |

FOREIGN PATENT DOCUMENTS

| | | |
|---|---|---|
| JP | 2003-318325 A | 11/2003 |
| JP | 2009-194022 A | 8/2009 |
| JP | 2009-194144 A | 8/2009 |
| JP | 2010-278084 A | 12/2010 |
| JP | 2010-538467 A | 12/2010 |
| JP | 2011-071256 A | 4/2011 |
| JP | 2011-114133 A | 6/2011 |
| WO | 20041010497 A1 | 1/2004 |
| WO | 20061088005 A1 | 8/2006 |

OTHER PUBLICATIONS

Official Communication issued in corresponding Japanese Patent Application No. 2014-111113, mailed on Oct. 7, 2015.

* cited by examiner

SEMICONDUCTOR DEVICE AND SEMICONDUCTOR MODULE

BACKGROUND OF THE INVENTION

1. Field of the Invention

The present invention relates to a semiconductor device, and more particularly to a semiconductor device with an analog integrated circuit and a digital integrated circuit mounted thereon.

2. Description of the Related Art

The present invention also relates to a semiconductor module, and more particularly to a semiconductor module including a surface-mounted or built-in semiconductor device having an analog integrated circuit and a digital integrated circuit.

An example of this type of device is disclosed in Japanese Patent Laying-Open No. 2001-156209. According to this background art, a circuit element formation region is assigned to the central part of the upper surface of a silicon substrate, and outside of that region, a plurality of contact pads for signaling and a single contact pad for grounding are provided. A redistribution trace for signaling is provided to extend from the upper surface of the contact pad for signaling to the upper surface of an insulating film. A projection electrode is provided on the upper surface of a pad portion located at the leading end of the redistribution trace. A ground layer is provided on the upper surface of the insulating film on the circuit element formation region so as to avoid the redistribution trace for signaling and its neighboring area, and is connected to the contact pad for grounding via the redistribution trace for grounding. Another projection electrode is provided at a predetermined place on the upper surface of the ground layer.

However, when forming a plurality of integrated circuits, such as an analog integrated circuit and a digital integrated circuit, in a circuit element formation region, noise produced in a certain integrated circuit may affect another integrated circuit through a ground layer. Particularly, high frequency noise produced in the digital integrated circuit may destabilize the operation of the analog integrated circuit.

SUMMARY OF THE INVENTION

Accordingly, preferred embodiments of the present invention provide a semiconductor device or a semiconductor module that prevents or significantly reduces an influence on an analog integrated circuit exerted by noise produced in a digital integrated circuit.

A semiconductor device according to a preferred embodiment of the present invention includes a semiconductor substrate including a major surface in which a first region and a second region are provided, an analog integrated circuit provided in the first region of the major surface, a digital integrated circuit provided in the second region of the major surface, and a ground layer facing the first region and the second region. The analog integrated circuit and the digital integrated circuit are provided with an analog ground terminal and a digital ground terminal, respectively. The ground layer is divided into an analog ground layer facing the first region and a digital ground layer facing the second region. The analog ground terminal and the digital ground terminal are connected to the analog ground layer and the digital ground layer, respectively. The digital ground terminal is divided into a plurality of ground terminals. The digital ground layer is divided into a plurality of ground layers to which the plurality of ground terminals are connected, respectively. The analog integrated circuit includes at least a portion of an analog-side conversion circuit that performs processing on an analog side in analog-digital conversion processing. The digital integrated circuit includes at least a portion of a digital-side conversion circuit that performs processing on a digital side in the analog-digital conversion processing. The analog ground terminal is connected to the analog-side conversion circuit. One of the plurality of ground terminals is connected to the digital-side conversion circuit.

Preferably, the digital integrated circuit further includes a plurality of digital circuits and a plurality of power supply terminals connected to the plurality of digital circuits, respectively.

Preferably, the digital-side conversion circuit is connected to any one of the plurality of power supply terminals.

Preferably, the semiconductor device further includes a floating layer facing the second region. At least one of the plurality of ground terminals is also connected to the floating layer.

Preferably, the semiconductor device further includes an insulating layer located on the plurality of power supply terminals and the ground layer, a first through-hole provided in the insulating layer in correspondence to the position of each of the plurality of power supply terminals, a second through-hole provided in the insulating layer in correspondence to the position of the digital ground layer, a power supply electrode member connected to each of the plurality of power supply terminals through the first through-hole, and a ground electrode member connected to the digital ground layer through the second through-hole. Preferably, the power supply electrode member is arranged at a position farther from the insulating layer than the ground electrode member.

Preferably, one or more openings are provided in each of the analog ground layer and the digital ground layer.

A semiconductor module according to another preferred embodiment the present invention includes a surface-mounted or built-in semiconductor package. The semiconductor package includes a semiconductor substrate including a major surface in which a first region and a second region are provided, an analog integrated circuit provided in the first region of the major surface, a digital integrated circuit provided in the second region of the major surface, and a ground layer facing the first region and the second region. In the semiconductor package, the analog integrated circuit and the digital integrated circuit are provided with an analog ground terminal and a digital ground terminal, respectively. The ground layer is divided into an analog ground layer facing the first region and a ground layer facing the second region. The analog ground terminal and the digital ground terminal are connected to the analog ground layer and the digital ground layer, respectively. The digital ground terminal is divided into a plurality of ground terminals. The digital ground layer is divided into a plurality of ground layers to which the plurality of ground terminals are connected, respectively.

Preferably, the semiconductor device further includes a power supply electrode member connected to the digital integrated circuit, and a ground electrode member arranged between the digital integrated circuit and the power supply electrode member and connected to the digital ground layer.

A semiconductor device according to a preferred embodiment of the present invention includes a semiconductor substrate including a major surface in which a first region and a second region are provided, an analog integrated circuit provided in the first region of the major surface, a digital integrated circuit provided in the second region of the major surface, and a ground layer facing the first region and the second region. The analog integrated circuit and the digital integrated circuit are provided with an analog ground terminal and a digital ground terminal, respectively. The ground layer is divided into an analog ground layer facing the first region and a digital ground layer facing the second region. The analog ground terminal and the digital ground terminal are connected to the analog ground layer and the digital ground layer, respectively. The digital ground terminal is divided into a plurality of ground terminals. The digital ground layer is divided into a plurality of ground layers to which the plurality of ground terminals are connected, respectively.

According to various preferred embodiments of the present invention, a ground layer is divided into an analog ground layer facing a first region for an analog integrated circuit, and a digital ground layer covering a second region for a digital integrated circuit. Accordingly, a phenomenon in which noise produced in the digital integrated circuit affects the analog integrated circuit through the ground layer is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
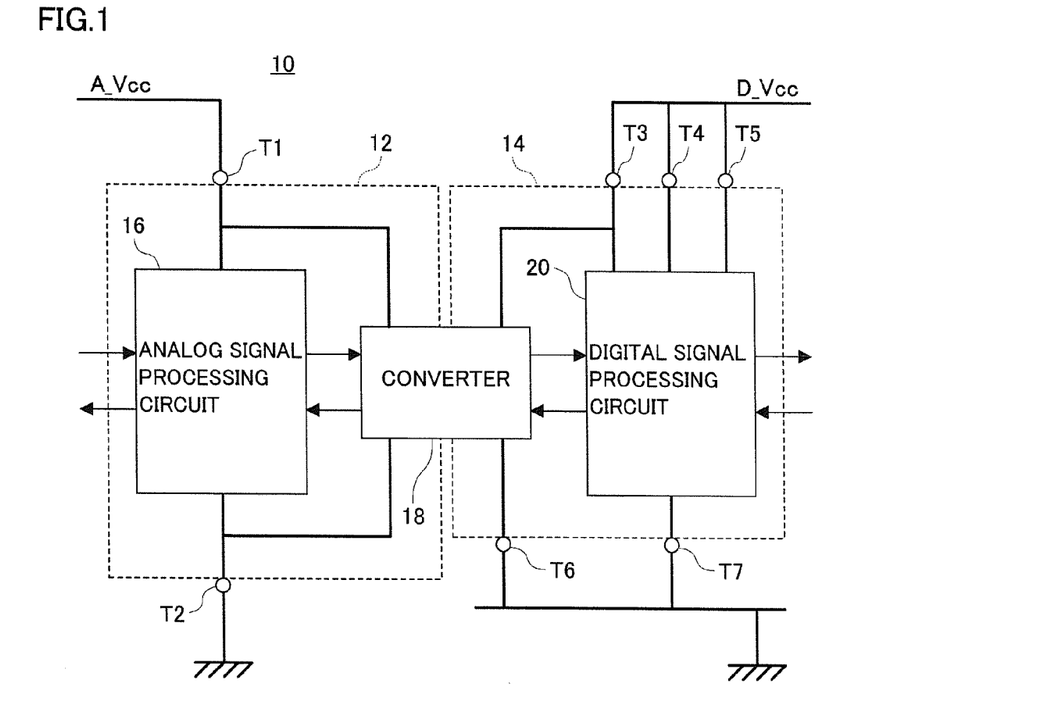
FIG. 1 is a block diagram showing an example of a semiconductor device according to a preferred embodiment of the present invention.

Referring to FIG. 1, a semiconductor device 10 according to a preferred embodiment of the present invention includes an analog integrated circuit 12 and a digital integrated circuit 14. Analog integrated circuit 12 is provided with an analog signal processing circuit 16 and a portion of a converter 18, and digital integrated circuit 14 is provided with the other portion of converter 18 and a digital signal processing circuit 20.

An analog signal processed by analog signal processing circuit 12 is converted into a digital signal by converter 18, and the converted digital signal is supplied to digital signal processing circuit 20. A digital signal processed by digital signal processing circuit 20 is converted into an analog signal by converter 18, and the converted analog signal is supplied to analog signal processing circuit 16.

Analog integrated circuit 12 is provided with an analog power supply terminal T1 and an analog ground terminal T2. Both analog power supply terminal T1 and analog ground terminal T2 are connected to both analog signal processing circuit 16 and converter 18. An analog power supply voltage A_Vcc is supplied to analog signal processing circuit 16 and converter 18 via analog power supply terminal T1. Analog ground terminal T2 is connected to the ground.

Digital integrated circuit 20 is provided with digital power supply terminals T3 to T5 and digital ground terminals T6 and T7. Digital power supply terminal T3 is connected to both converter 18 and digital signal processing circuit 20, and digital power supply terminals T4 and T5 are connected only to digital signal processing circuit 20. Digital ground terminal T6 is connected only to converter 18, and digital ground terminal T7 is connected only to digital signal processing circuit 20.

A digital power supply voltage D_Vcc is supplied to converter 18 and digital signal processing circuit 20 via digital power supply terminals T3 to T5. Digital ground terminals T6 and T7 are connected to the ground.

It is noted that, in order to enhance flexibility in designing a redistribution layer which will be described later, an input end of digital power supply voltage D-Vcc is shared by digital power supply terminals T3 to T5, and a connection end to a reference potential plane is shared by digital ground terminals T6 and T7.

Analog signal processing circuit 16 executes analog signal processing based on analog power supply voltage A_Vcc, and digital signal processing circuit 20 executes digital signal processing based on digital power supply voltage D_Vcc. Converter 18 executes conversion processing on the analog side based on analog power supply voltage A_Vcc, and executes conversion processing on the digital side based on digital power supply voltage D_Vcc.

Figure 2:
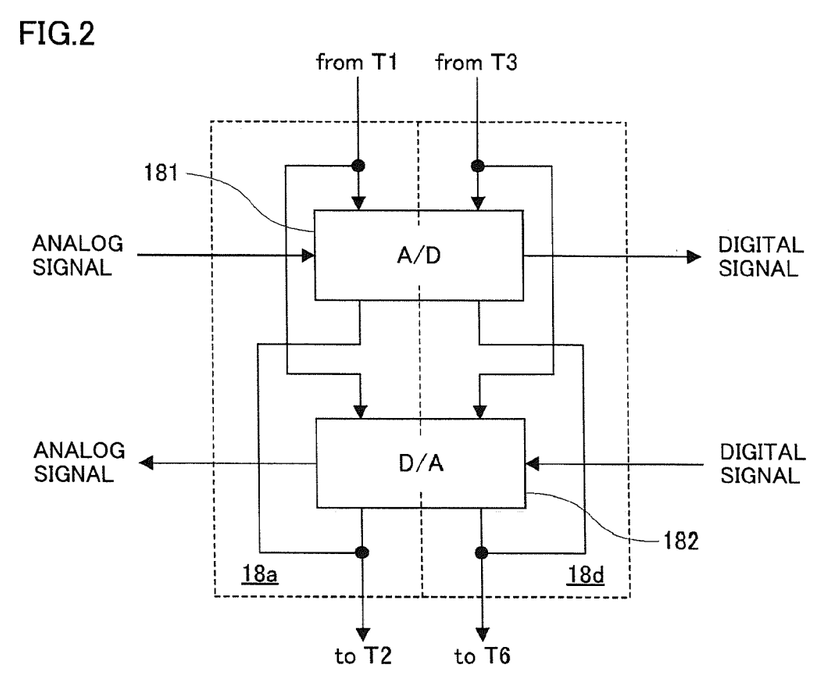
FIG. 2 is a block diagram showing an example of a configuration of a converter applied to the semiconductor device shown in FIG. 1.

Referring to FIG. 2, converter 18 preferably includes an A/D conversion circuit 181 and a D/A conversion circuit 182. An analog signal output from analog signal processing circuit 16 is converted into a digital signal by A/D conversion circuit 181, and a digital signal output from digital signal processing circuit 20 is converted into an analog signal by D/A conversion circuit 182. The digital signal converted by A/D conversion circuit 181 is supplied to digital signal processing circuit 20, and the analog signal converted by D/A conversion circuit 182 is supplied to analog signal processing circuit 16.

Here, of A/D conversion circuit 181 and D/A conversion circuit 182, at least a portion of the circuits which is responsible for conversion processing on the analog side belongs to an analog-side conversion circuit 18a, and at least a portion of the circuits which is responsible for conversion processing on the digital side belongs to a digital-side conversion circuit 18d. Analog power supply terminal T1 and analog ground terminal T2 are connected to analog-side conversion circuit 18a, and digital power supply terminal T3 and digital ground terminal T6 are connected to digital-side conversion circuit 18d.

Figure 3:
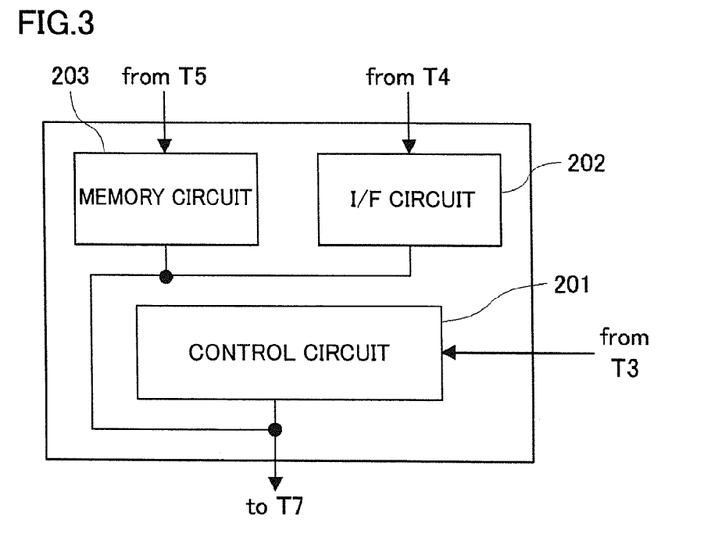
FIG. 3 is a block diagram showing an example of a configuration of a digital signal processing circuit applied to the semiconductor device shown in FIG. 1.

Referring to FIG. 3, digital signal processing circuit includes a control circuit 201, an I/F circuit 202 and a memory circuit 203. Digital power supply terminal T3 is connected to control circuit 201, and digital power supply terminal T4 is connected to I/F circuit 202. Digital power supply terminal T5 is connected to memory circuit 203. Digital ground terminal T7 is connected in common to control circuit 201, I/F circuit 202 and memory circuit 203.

Figure 5A:
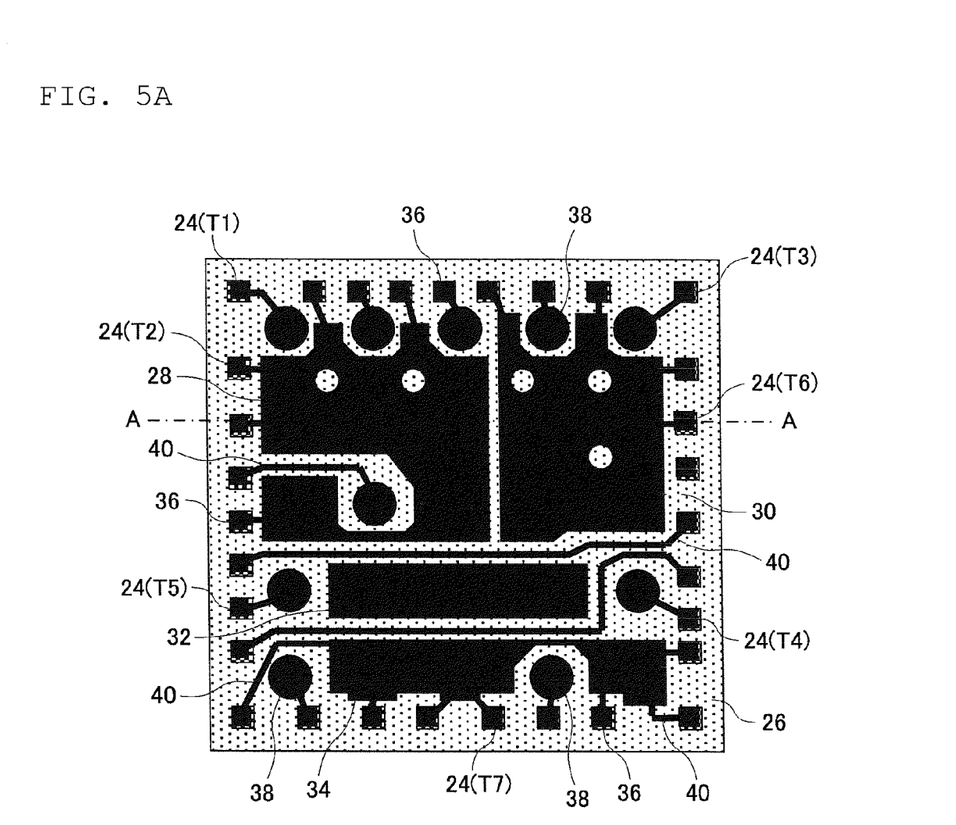
FIG. 5A is an illustration showing an example of an insulating layer and a redistribution layer stacked on the stack shown in FIG. 4A.
Figure 5B:
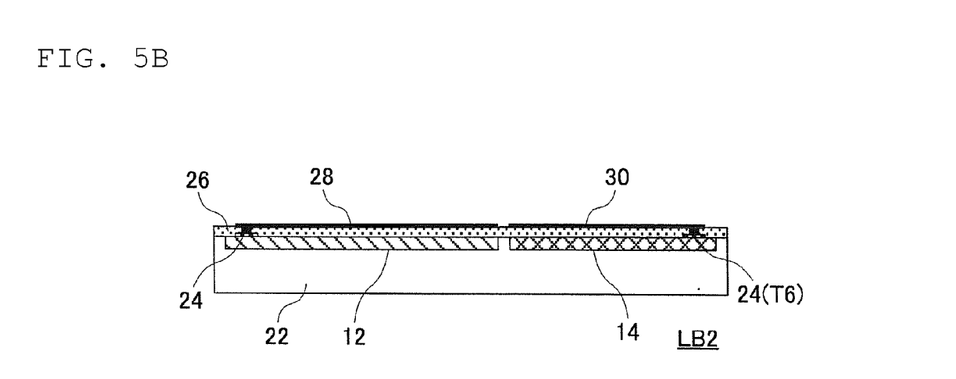
FIG. 5B is a cross-sectional view of the stack shown in FIG. 5A taken along the line A-A.
Figure 6A:
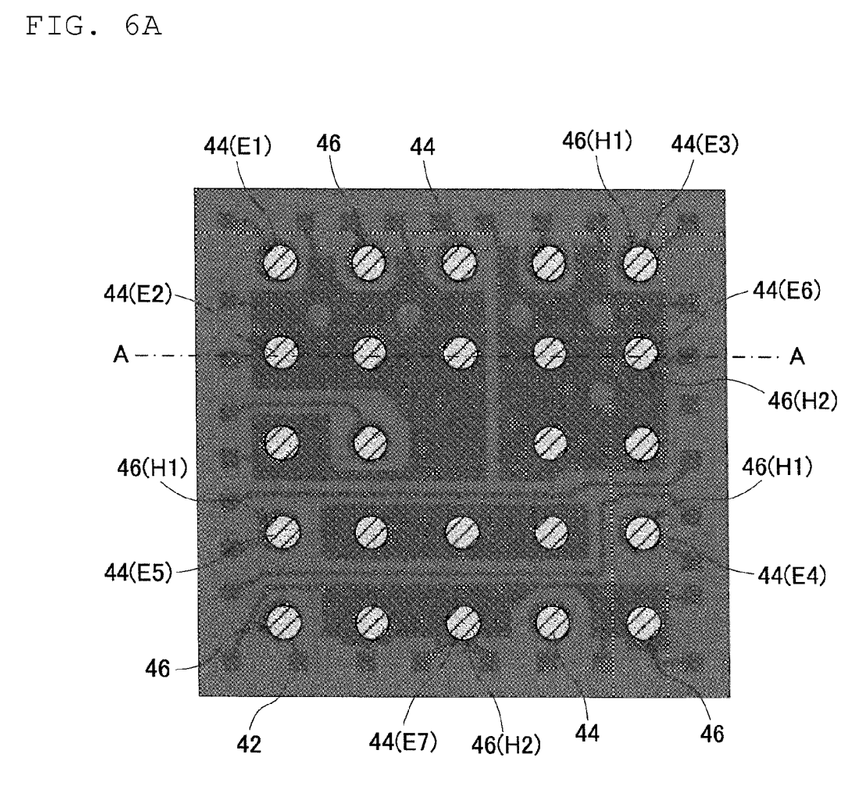
FIG. 6A is an illustration showing an example of another insulating layer and a post electrode stacked on the stack shown in FIG. 5A.
Figure 6B:
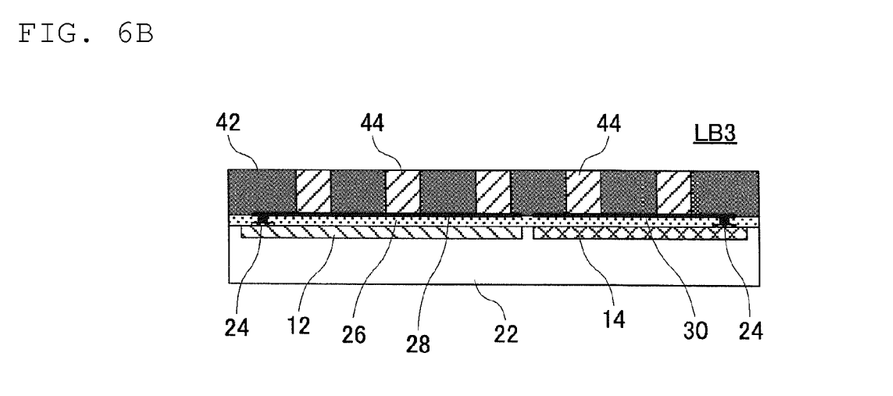
FIG. 6B is a cross-sectional view of the stack shown in FIG. 6A taken along the line A-A.
Figure 7:
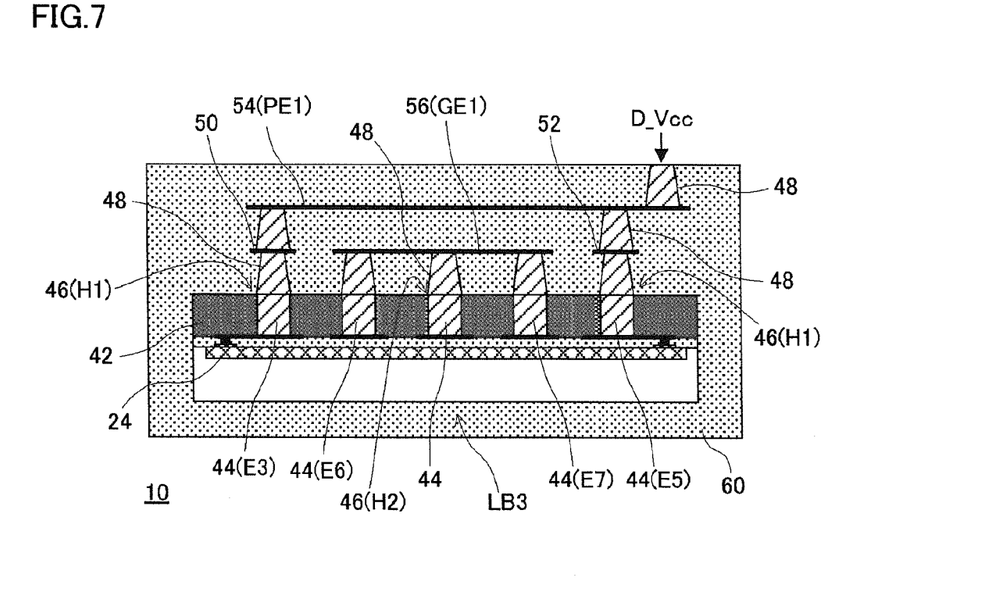
FIG. 7 is a cross-sectional view of a semiconductor device produced by sealing the stack shown in FIG. 6A.

Semiconductor device 10 shown in FIG. 1 is completed by sealing a semiconductor package (=a stack LB3) produced through a manufacturing process shown in FIGS. 4A and 4B to FIGS. 6A and 6B, in the manner shown in FIG. 7. Here, although a WL-CSP (Wafer Level Chip Size Package) process preferably is adopted as a manufacturing process of a semiconductor package, and formation of the redistribution layer is included in the process performed on a wafer level, description will be made assuming a chip state from the beginning, for convenience.

Figure 4A:
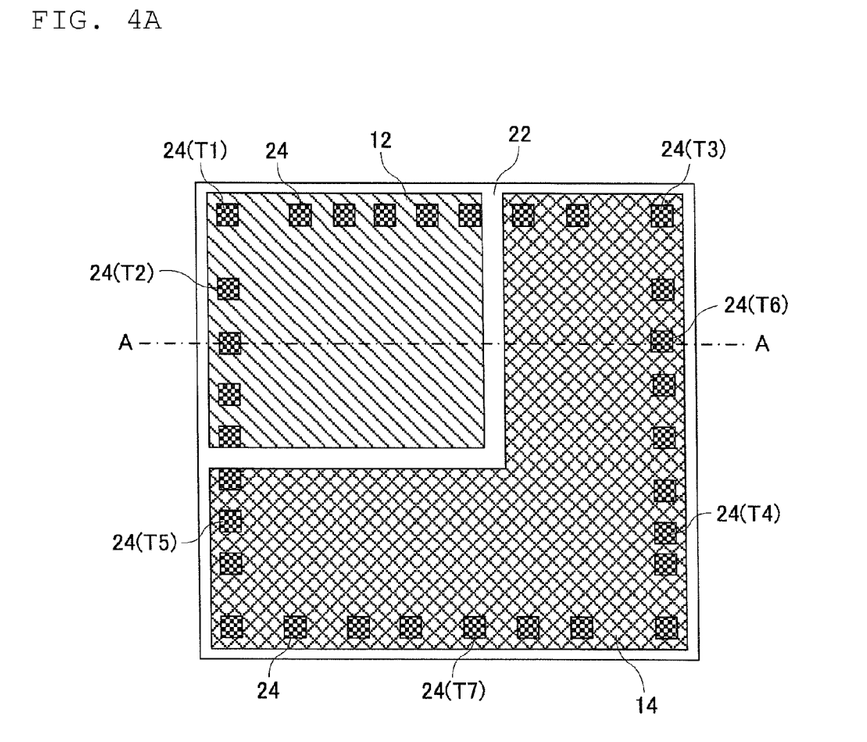
FIG. 4A is an illustration showing an example of a functional surface formed on a substrate.
Figure 4B:
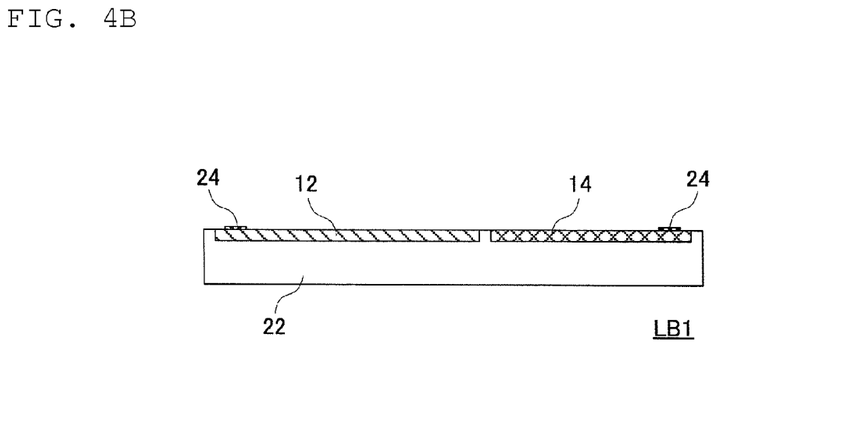
FIG. 4B is a cross-sectional view of the stack shown in FIG. 4A taken along the line A-A.

First, referring to FIGS. 4A and 4B, analog integrated circuit 12 is formed in a certain region (i.e., a hatched rectangular region shown in FIG. 4) of the upper surface of a semiconductor substrate 22, and digital integrated circuit 14 is formed in another region (i.e., an L-shaped or substantially L-shaped region shown in FIG. 4 by halftone dot meshing) of the upper surface of semiconductor substrate 22. A plurality of pad electrodes 24 are formed at the edge of the upper surface of semiconductor substrate 22. Portions of these pad electrodes 24 are connected to analog integrated circuit 12, and other portions of these pad electrodes 24 are connected to digital integrated circuit 14. A stack LB1 whose upper surface corresponds to a functional surface is thus obtained.

It is noted that the portions of pad electrodes 24 connected to analog integrated circuit 12 corresponds to analog power supply terminal T1 and analog ground terminal T2. The portion of pad electrodes 24 connected to digital integrated circuit 14 corresponds to digital power supply terminals T3 to T5 and digital ground terminals T6 and T7.

Referring to FIGS. 5A and 5B, a region of the upper surface of stack LB1 excluding pad electrodes 24 is covered by an insulating layer 26. A redistribution layer is stacked on insulating layer 26. The redistribution layer preferably includes a single analog ground layer 28, three digital ground layers 30 to 34, a plurality of pad electrode layers 36, a plurality of post electrode layers 38, and a plurality of routing traces 40. Furthermore, two openings each preferably having a circular or substantially circular shape are provided in analog ground layer 28, and three openings each preferably having a circular or substantially circular shape are also provided in digital ground layer 30. It is noted that these openings are provided to adjust the remaining copper ratio in analog ground layer 28 and digital ground layer 30 (either ground layer is preferably made of a highly conductive material, such as copper).

Here, analog ground layer 28 is provided at a position facing analog integrated circuit 12, and digital ground layers 30 to 34 are provided at a position facing digital integrated circuit 14. Pad electrode layer 36 is provided on pad electrodes 24, and post electrode layer 38 is provided at a position where post electrodes 44 which will be described later are to be arranged. Furthermore, routing trace 40 is arranged so as to connect pad electrode layer 24 to analog ground layer 28, digital ground layer 30, digital ground layer 34, post electrode layer 38, or another pad electrode layer 24. Digital ground layer 32 is a floating layer not connected to any of pad electrode layers 24. A stack LB2 with insulating layer 26 and the redistribution layer provided on its upper surface is thus obtained.

It is noted that pad electrode 24 corresponding to analog power supply terminal T1 is connected to post electrode layer 38 through pad electrode layer 36 and routing trace 40, and pad electrode 24 corresponding to analog ground terminal T2 is connected to analog ground layer 28 through pad electrode layer 36 and routing trace 40.

Pad electrode 24 corresponding to each of digital power supply terminals T3 to T5 is connected to post electrode layer 38 through pad electrode layer 36 and routing trace 40. Pad electrode 24 corresponding to digital ground terminal T6 is connected to digital ground layer 30 through pad electrode layer and routing trace 40. Pad electrode 24 corresponding to digital ground terminal T7 is connected to digital ground layer 34 through pad electrode layer 36 and routing trace 40.

It is noted that at least one of pad electrode 24 corresponding to digital ground terminal T6 and pad electrode 24 corresponding to digital ground terminal T7 may further be connected to digital ground layer 32.

By assigning digital power supply terminals T3 to T5 at a distance from one another and dividing the ground layer facing digital integrated circuit 14 into three digital ground layers 30 to 34, the flexibility in routing a trace that supplies digital power supply voltage D_Vcc to avoid the neighboring area of digital-side conversion circuit 18d is secured. Such flexibility in routing and the shielding function of digital ground layer 32 in a floating state significantly reduces or prevents the phenomenon in which noise produced in digital-side conversion circuit 18d is superimposed on digital power supply voltage D_Vcc.

Specifically, if noise produced in digital integrated circuit 14 is superimposed on digital power supply voltage D_Vcc simultaneously with digital ground layers 30 to 34, this noise will be superimposed on a digital signal line and a digital ground electrode in phase to become common mode noise, which will be superimposed on digital-side conversion circuit 18d since a capacitor or the like provided between the signal line and the ground cannot remove noise. Moreover, since digital ground layers 30 to 34 are ground electrodes preferably having a thin electrode thickness (e.g., a thickness of about 1 μm to about 5 μm) produced by a thin film method, the potential of the ground cannot be kept constant, and noise cannot be removed in this ground layer. The noise will thus be transmitted to analog-side conversion circuit 18a. Since this noise may be converted into normal mode noise from common mode noise, common mode noise or normal mode noise will be superimposed on a weak signal which is being processed in analog integrated circuit 16, which causes spurious noise to occur. Accordingly, a packet error rate which is a critical issue in wireless communications will be increased, causing degradation in communication speed and communication quality. On the other hand, as described in this preferred embodiment, by routing the trace that supplies digital power supply voltage D_Vcc to avoid the neighboring area of digital-side conversion circuit 18d, noise superimposed on digital power supply voltage D_Vcc is significantly reduced or prevented. This provides a stabilized operation of analog-side conversion circuit 18a, a reduced packet error rate and improved communication quality. It is noted that, although noise transmitted to analog-side conversion circuit 18a has been described herein with reference to the example where noise produced in digital integrated circuit 14 becomes common mode noise and is transmitted to analog-side conversion circuit 18a, a noise transfer pattern includes various modes, such as common mode noise becoming normal mode noise and being transmitted.

Referring to FIGS. 6A and 6B, the upper surface of stack LB2 is covered by an insulating layer 42 including a plurality of through-holes 46. Post electrode layers 38 are exposed in some of a plurality of through-holes 46 and a portion of each of analog ground layer 28 and digital ground layers 30 to 34 is exposed in other some of the plurality of through-holes 46. A plurality of post electrodes 44 are embedded in these through-holes 46, respectively.

Accordingly, a certain post electrode 44 is connected to analog power supply terminal T1 with post electrode layer 38 interposed therebetween, and another post electrode 44 is connected to analog ground terminal T2 with analog ground layer interposed therebetween. A certain post electrode 44 is connected to digital power supply terminal T3, T4 or T5 with post electrode layer 38 interposed therebetween, and anther post electrode is connected to digital ground terminal T6 with digital ground layer 30 interposed therebetween. Still another post electrode is connected to digital ground terminal T7 with digital ground layer 34 interposed therebetween. A stack LB3 with insulating layer 46 and a plurality of post electrodes 44 provided on its upper surface is thus obtained.

Here, post electrode 44 connected to analog power supply terminal T1 is particularly defined as a "post electrode E1", and post electrode 44 connected to analog ground terminal T2 is particularly defined as a "post electrode E2."

Post electrode 44 connected to digital power supply terminal T3 is particularly defined as a "post electrode E3." Post electrode 44 connected to digital power supply terminal T4 is particularly defined as "post electrode E4." Post electrode 44 connected to digital power supply terminal T5 is particularly defined as a "post electrode E5." Furthermore, post electrode 44 connected to digital ground terminal T6 is particularly defined as a "post electrode E6", and post electrode 44 connected to digital ground terminal T7 is particularly defined as a "post electrode E7."

Each of through-holes 46, 46 and 46 in which post electrodes E3 to E5 are embedded, respectively, is particularly defined as a "through-hole H1", and each of through-holes 46 and 46 in which post electrodes E6 and E7 are embedded, respectively, is particularly defined as a "through-hole H2."

Referring to FIG. 7, stack LB3, namely, a semiconductor package is sealed by a resin 60 together with wiring conductors 50 to 56. It should be noted that a plurality of via holes 48 are provided in resin 60. It is noted that the material of resin 60 is preferably a flexible resin that allows for sheet lamination, such as a liquid crystal polymer or polyimide, as it allows easy wiring in a semiconductor package. A semiconductor package may be mounted on the surface of resin 60.

Digital power supply voltage D_Vcc is supplied to post electrode E3 through via hole 48 and wiring conductors 54 and 50, and is supplied to post electrode E5 through via hole 48 and wiring conductors 54 and 52. Digital power supply circuit D_Vcc is also supplied to post electrode E4 (see FIG. 6) through via hole 48, wiring conductor 56 and a wiring conductor not shown.

Post electrodes 44 connected to post electrodes E6, E7 and digital ground electrode 32 (see FIG. 5) are connected to each other through via hole 48 and wiring conductor 56. Therefore, wiring conductor 54 can be defined as a "digital power supply electrode PE1", and wiring conductor 56 can be defined as a "digital ground electrode GE1."

Here, the distance from the upper surface of stack LB3 to digital power supply electrode PE1 is longer than the distance from the upper surface of stack LB3 to digital ground electrode GE1, and digital ground electrode GE1 is interposed between digital power supply electrode PE1 and digital integrated circuit 24. Noise produced in digital-side conversion circuit 18d constituting converter 18 is also shielded by digital ground electrode GE1, which significantly reduces or eliminates noise to be superimposed on digital power supply voltage D_Vcc. This prevents noise produced in digital integrated circuit 14 from becoming common mode noise which will be superimposed on digital ground layers 30 to 34 and a digital power supply in phase, and noise can be shielded only by digital ground layers 30 to 34.

As can be seen from the above description, semiconductor substrate 22 includes a major surface on which the rectangular region and the L-shaped or substantially L-shaped region are assigned. Analog integrated circuit 12 is provided in the major surface of semiconductor substrate 22 in correspondence to the rectangular or substantially rectangular region, and digital integrated circuit 14 is provided in the major surface of semiconductor substrate 22 in correspondence to the L-shaped or substantially L-shaped region. Analog ground terminal T2 is provided for analog integrated circuit 12, and digital ground terminals T6 and T7 are provided for digital integrated circuit 14. Analog ground layer 28 is stacked on semiconductor substrate 22 so as to face analog integrated circuit 12, and digital ground layers 30 and 34 are stacked on semiconductor substrate 22 so as to face digital integrated circuit 14. Analog ground terminal T2 is connected to analog ground layer 28, and digital ground terminals T6 and T7 are connected to digital ground layers 30 and 34, respectively.

By arranging analog ground layer 28 and digital ground layers 30 and 34 as described above, the phenomenon in which noise produced in digital integrated circuit 14 affects analog integrated circuit 12 is significantly reduced or prevented. Moreover, by securing the flexibility in routing of routing trace 40 in the redistribution layer, arranging digital ground layer 32 in the floating state, and further, providing digital power supply electrode PE1 at a farther position from digital ground electrode GE1 on the outside of the semiconductor package, the phenomenon in which noise produced in digital-side conversion circuit 18d is superimposed on digital power supply voltage D_Vcc is significantly reduced or prevented, which in turn stabilizes the operation of analog-side conversion circuit 18a.

Figure 8:
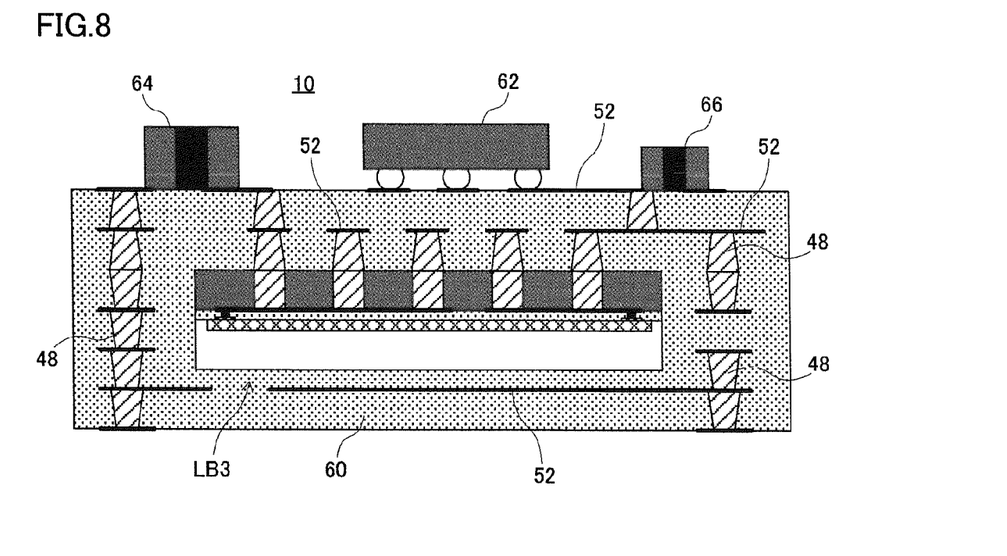
FIG. 8 is a cross-sectional view of another semiconductor device produced by sealing the stack shown in FIG. 6A.

It is noted that semiconductor device 10 of this preferred embodiment has a cross-sectional structure shown in FIG. 7. However, the semiconductor package, namely, stack LB3 may be sealed in the way shown in FIG. 8 to produce another semiconductor device 10. Also in semiconductor device 10 shown in FIG. 8, stack LB3 is sealed by resin 60 together with a plurality of wiring conductors 52, and a plurality of via holes 48 are provided in resin 60. It should be noted that some of wiring conductors 52 are exposed at the upper and lower surfaces of resin 60, and semiconductor devices 62, 64 and 66 are mounted on the upper surface of resin 60. Semiconductor device 10 that can execute more complicated processing is thus obtained.

The semiconductor device according to various preferred embodiments of the present invention is not limited to a semiconductor module, but may have a configuration such that circuit elements are mounted on a printed circuit board, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A semiconductor device comprising:
   a semiconductor substrate including a major surface in which a first region and a second region are provided;
   an analog integrated circuit provided in the first region of the major surface;
   a digital integrated circuit provided in the second region of the major surface; and
   a ground layer facing the first region and the second region; wherein
   the analog integrated circuit and the digital integrated circuit include an analog ground terminal and a digital ground terminal, respectively;

the ground layer is divided into an analog ground layer facing the first region and a digital ground layer facing the second region;
the analog ground terminal and the digital ground terminal are connected to the analog ground layer and the digital ground layer, respectively;
the analog ground terminal includes only a single terminal;
the analog ground layer includes only a single layer;
the digital ground terminal is divided into a plurality of ground terminals;
the digital ground layer is divided into a plurality of ground layers to which the plurality of ground terminals are connected, respectively;
the analog integrated circuit includes at least a portion of an analog-side conversion circuit which performs processing on an analog side in analog-digital conversion processing;
the digital integrated circuit includes at least a portion of a digital-side conversion circuit which performs processing on a digital side in the analog-digital conversion processing;
the analog ground terminal is connected to the analog-side conversion circuit; and
one of the plurality of ground terminals is connected to the digital-side conversion circuit.

2. The semiconductor device according to claim 1, wherein the digital integrated circuit further includes a plurality of digital circuits and a plurality of power supply terminals connected to the plurality of digital circuits, respectively.

3. The semiconductor device according to claim 2, wherein the digital-side conversion circuit is connected to any one of the plurality of power supply terminals.

4. The semiconductor device according to claim 2, further comprising a floating layer facing the second region; wherein
at least one of the plurality of ground terminals is also connected to the floating layer.

5. The semiconductor device according to claim 2, further comprising:
an insulating layer provided on the plurality of power supply terminals and the ground layer;
a first through-hole provided in the insulating layer in correspondence to a position of each of the plurality of power supply terminals;
a second through-hole provided in the insulating layer in correspondence to a position of the digital ground layer;
a power supply electrode member connected to each of the plurality of power supply terminals through the first through-hole; and
a ground electrode member connected to the digital ground layer through the second through-hole.

6. The semiconductor device according to claim 5, wherein the power supply electrode member is arranged at a position farther from the insulating layer than the ground electrode member.

7. The semiconductor device according to claim 1, wherein one or more openings are provided in each of the analog ground layer and the digital ground layer.

8. A semiconductor module comprising a surface-mounted or built-in semiconductor package including a semiconductor substrate that includes a major surface in which a first region and a second region are provided, an analog integrated circuit provided in the first region of the major surface, a digital integrated circuit provided in the second region of the major surface in correspondence to the second region, and a ground layer facing the first region and the second region; wherein in the semiconductor package:
the analog integrated circuit and the digital integrated circuit include an analog ground terminal and a digital ground terminal, respectively;
the ground layer is divided into an analog ground layer facing the first region and a digital ground layer facing the second region;
the analog ground terminal and the digital ground terminal are connected to the analog ground layer and the digital ground layer, respectively;
the analog ground terminal includes only a single terminal;
the analog ground layer includes only a single layer;
the digital ground terminal is divided into a plurality of ground terminals;
the digital ground layer is divided into a plurality of ground layers to which the plurality of ground terminals are connected, respectively;
the analog integrated circuit includes at least a portion of an analog-side conversion circuit which performs processing on an analog side in analog-digital conversion processing;
the digital integrated circuit includes at least a portion of a digital-side conversion circuit which performs processing on a digital side in the analog-digital conversion processing;
the analog ground terminal is connected to the analog-side conversion circuit; and
one of the plurality of ground terminals is connected to the digital-side conversion circuit.

9. The semiconductor module according to claim 8, further comprising:
a power supply electrode member connected to the digital integrated circuit; and
a ground electrode member arranged between the digital integrated circuit and the power supply electrode member and connected to the digital ground layer.

10. The semiconductor module according to claim 8, wherein the digital integrated circuit further includes a plurality of digital circuits and a plurality of power supply terminals connected to the plurality of digital circuits, respectively.

11. The semiconductor module according to claim 10, wherein the digital-side conversion circuit is connected to any one of the plurality of power supply terminals.

12. The semiconductor module according to claim 10, further comprising a floating layer facing the second region; wherein
at least one of the plurality of ground terminals is also connected to the floating layer.

13. The semiconductor device according to claim 10, further comprising:
an insulating layer provided on the plurality of power supply terminals and the ground layer;
a first through-hole provided in the insulating layer in correspondence to a position of each of the plurality of power supply terminals;
a second through-hole provided in the insulating layer in correspondence to a position of the digital ground layer;
a power supply electrode member connected to each of the plurality of power supply terminals through the first through-hole; and
a ground electrode member connected to the digital ground layer through the second through-hole.

14. The semiconductor module according to claim 13, wherein the power supply electrode member is arranged at a position farther from the insulating layer than the ground electrode member.

15. The semiconductor module according to claim 8, wherein one or more openings are provided in each of the analog ground layer and the digital ground layer.

16. A semiconductor device comprising:
- a semiconductor substrate including a major surface in which a first region and a second region are provided;
- an analog integrated circuit provided in the first region of the major surface;
- a digital integrated circuit provided in the second region of the major surface;
- a ground layer facing the first region and the second region;
- an analog power supply terminal provided with the analog integrated circuit; and
- a digital power supply terminal provided with the digital integrated circuit; wherein
- the analog integrated circuit and the digital integrated circuit include an analog ground terminal and a digital ground terminal, respectively;
- the ground layer is divided into an analog ground layer facing the first region and a digital ground layer facing the second region;
- the analog ground terminal and the digital ground terminal are connected to the analog ground layer and the digital ground layer, respectively;
- the digital ground terminal is divided into a plurality of ground terminals;
- the digital ground layer is divided into a plurality of ground layers to which the plurality of ground terminals are connected, respectively;
- the digital power supply terminal is divided into a plurality of power supply terminals;
- the digital integrated circuit includes a plurality of digital circuits and at least a portion of a digital-side conversion circuit which performs processing on a digital side in the analog-digital conversion processing;
- a plurality of routing traces are connected to the plurality of power supply terminals, respectively, and supplying electric power to the plurality of digital circuits and the digital-side conversion circuit; and
- the plurality of routing traces are provided in the digital ground layer.

17. A semiconductor module comprising a surface-mounted or built-in semiconductor package including a semiconductor substrate that includes a major surface in which a first region and a second region are provided, an analog integrated circuit provided in the first region of the major surface, a digital integrated circuit provided in the second region of the major surface in correspondence to the second region, and a ground layer facing the first region and the second region; wherein
- in the semiconductor package:
  - the analog integrated circuit and the digital integrated circuit include an analog ground terminal and a digital ground terminal, respectively;
  - the analog integrated circuit includes an analog power supply terminal;
  - the digital integrated circuit includes a digital power supply terminal;
  - the digital power supply terminal is divided into a plurality of power supply terminals;
  - the ground layer is divided into an analog ground layer facing the first region and a digital ground layer facing the second region;
  - the analog ground terminal and the digital ground terminal are connected to the analog ground layer and the digital ground layer, respectively;
  - the digital ground terminal is divided into a plurality of ground terminals;
  - the digital ground layer is divided into a plurality of ground layers to which the plurality of ground terminals are connected, respectively;
  - the digital integrated circuit includes a plurality of digital circuits and at least a portion of a digital-side conversion circuit which performs processing on a digital side in the analog-digital conversion processing;
  - the semiconductor package further comprises a plurality of routing traces connected to the plurality of power supply terminals, respectively, and supplying electric power to the plurality of digital circuits and the digital-side conversion circuit; and
  - the plurality of routing traces are provided in the digital ground layer.

* * * * *